(12) United States Patent
Chen et al.

(10) Patent No.: US 12,302,025 B2
(45) Date of Patent: May 13, 2025

(54) DEEP N-WELL DRIVEN RAMP BUFFER

(71) Applicant: OMNIVISION TECHNOLOGIES, INC., Santa Clara, CA (US)

(72) Inventors: Shan Chen, Sunnyvale, CA (US); Hiroaki Ebihara, San Jose, CA (US); Rui Wang, San Jose, CA (US); Zhenfu Tian, San Jose, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 159 days.

(21) Appl. No.: 18/167,665

(22) Filed: Feb. 10, 2023

(65) Prior Publication Data
US 2024/0276124 A1   Aug. 15, 2024

(51) Int. Cl.
*H04N 25/78* (2023.01)
*H04N 25/77* (2023.01)

(52) U.S. Cl.
CPC ............ *H04N 25/78* (2023.01); *H04N 25/77* (2023.01)

(58) Field of Classification Search
CPC ...... H04N 25/78; H04N 25/77; H04N 25/772; H01L 27/14643; H01L 27/14612; H01L 27/14605; H01L 27/14683
See application file for complete search history.

(56) References Cited

U.S. PATENT DOCUMENTS

| | | | |
|---|---|---|---|
| 11,189,655 B1* | 11/2021 | Mun | H01L 21/76229 |
| 11,785,353 B1* | 10/2023 | Hsieh | H04N 25/75 |
| | | | 348/297 |
| 2015/0349186 A1* | 12/2015 | Hsu | H01L 27/14683 |
| | | | 257/443 |
| 2024/0019300 A1* | 1/2024 | Ayel | H01L 27/14609 |
| 2024/0064430 A1* | 2/2024 | Tsukamoto | H04N 25/77 |

* cited by examiner

*Primary Examiner* — Christopher K Peterson
(74) *Attorney, Agent, or Firm* — Perkins Coie LLP; Daniel L. Jackstadt

(57) ABSTRACT

A local ramp buffer includes a deep N− well layer disposed in a P− substrate beneath a surface of the P− substrate, a P− well disposed between the surface of the P− substrate and the deep N− well layer, and an N− well structure disposed in the P− substrate and coupled to the deep N− well layer. The N− well structure is disposed between the surface of the P− substrate and the deep N− well layer. The P− well is disposed inside an opening in the N− well structure. The N− well structure and the deep N− well layer are configured to isolate the P− well within the opening. A source follower transistor is disposed in the P− well. The source follower transistor includes a gate terminal coupled to the N− well structure and a ramp generator.

18 Claims, 6 Drawing Sheets

US 12,302,025 B2

DEEP N-WELL DRIVEN RAMP BUFFER

TECHNICAL FIELD

This disclosure relates generally to image sensors, and in particular but not exclusively, relates to high dynamic range (HDR) complementary metal oxide semiconductor (CMOS) image sensors.

BACKGROUND

Image sensors have become ubiquitous and are now widely used in digital cameras, cellular phones, security cameras, as well as in medical, automotive, and other applications. As image sensors are integrated into a broader range of electronic devices, it is desirable to enhance their functionality, performance metrics, and the like in as many ways as possible (e.g., resolution, power consumption, dynamic range) through both device architecture design as well as image acquisition processing. The technology used to manufacture image sensors has continued to advance at a great pace. For example, the demands of higher resolution and lower power consumption have encouraged the further miniaturization and integration of these devices.

A typical image sensor operates in response to image light from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as analog output image signals on column bitlines that vary as a function of the incident image light. In other words, the amount of image charge generated is proportional to the intensity of the image light, which is read out as analog image signals from the column bitlines and converted to digital values to produce digital images (e.g., image data) representing the external scene. The analog image signals on the bitlines are coupled to readout circuits, which include input stages having analog-to-digital conversion (ADC) circuits to convert those analog image signals from the pixel array into the digital image signals.

BRIEF DESCRIPTION OF THE DRAWINGS

Non-limiting and non-exhaustive embodiments of the present disclosure are described with reference to the following figures, wherein like reference numerals refer to like parts throughout the various views unless otherwise specified.

Figure 1:
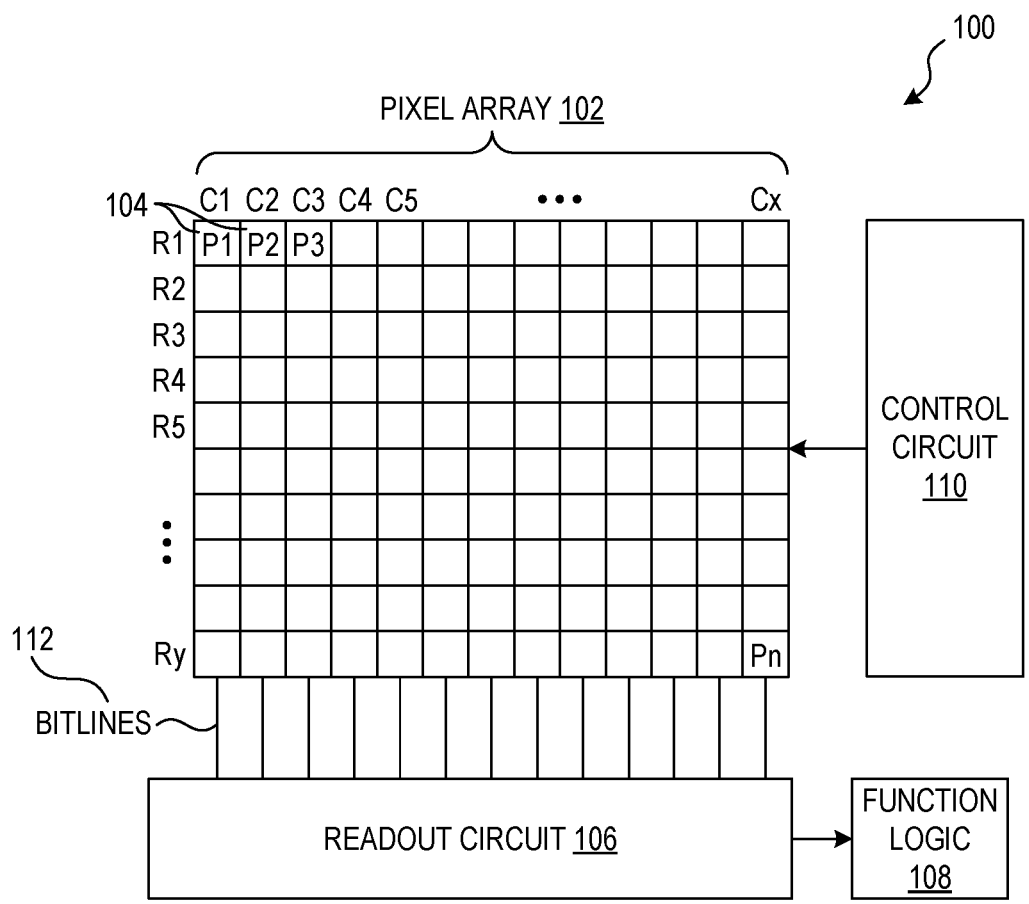
FIG. 1 illustrates one example of an imaging system including a pixel array in accordance with the teachings of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present disclosure. In addition, common but well-understood elements that are useful or necessary in a commercially feasible embodiment are often not depicted in order to facilitate a less obstructed view of these various embodiments of the present disclosure.

DETAILED DESCRIPTION

Examples directed to an imaging system with local ramp buffers in a pixel cell readout circuit providing improved power supply rejection ratio (PSRR) and reduced lateral layout size are disclosed. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present disclosure. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "over," "under," "above," "upper," "top." "bottom," "left," "right," "center," "middle," and the like, may be used herein for case of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein interpreted accordingly. In addition, it will also be understood that when an element is referred to as being "between" two other elements, it can be the only element between the two other elements, or one or more intervening elements may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be discussed, various examples of an imaging system with local ramp buffers in a pixel cell readout circuit providing improved power supply rejection ratio (PSRR) and reduced lateral layout size are disclosed. PSRR is a measure of a circuit's ability to reject changes in the supply voltage. It is a ratio, usually measured in decibels (dB), that compares the amplitude of a circuit's output signal to the amplitude of a perturbation in the supply voltage. In various examples, a gate terminal of a source follower transistor disposed in a P− well is coupled to an N− well structure and a global ramp generator. In other examples, a source terminal of a source follower transistor disposed in a P− well is coupled to an N− well structure and an output node.

Local ramp buffers with improved power supply rejection ratio (PSRR) performance and small lateral layout size provide a variety of benefits. It is noted that AC coupling paths from the power line to the output node due to parasitic diodes can decrease PSRR performance. In various examples, local ramp buffers without the AC coupling path from the power line to the output node provide improved PSRR performance as well as reduced lateral layout size in accordance with examples in accordance with the teachings of the present disclosure.

In various examples of the present disclosure, a local ramp buffer comprises a deep N− well layer disposed in a P− substrate beneath a surface of the P− substrate, a P− well disposed between the surface of the P− substrate and the deep N− well layer, an N− well structure disposed in the P− substrate and coupled to the deep N− well layer. The N− well structure is disposed between the surface of the P− substrate and the deep N− well layer. The P− well is disposed inside an opening in the N− well structure. The N− well structure and the deep N− well layer are configured to isolate the P− well within the opening in the N− well structure between the surface of the P− substrate and the deep N− well layer. A source follower transistor is disposed in the P− well. The source follower transistor includes a gate terminal coupled to the N− well structure and a global ramp generator. In other examples, the source follower transistor includes a source terminal that may be coupled to the N− well structure.

To illustrate, FIG. 1 shows one example of an imaging system 100 having a readout circuit 106 in accordance with the teachings of the present disclosure. In particular, the example depicted in FIG. 1 illustrates an imaging system 100 that includes a pixel array 102, bitlines 112, a control circuit 110, a readout circuit 106, and function logic 108. In one example, pixel array 102 is a two-dimensional (2D) array including a plurality of pixel circuits 104 (e.g., P1, P2, . . . Pn) that are arranged into rows (e.g., R1 to Ry) and columns (e.g., C1 to Cx) to acquire image data of a person, place, object, etc., which can then be used to render an image of a person, place, object, etc.

In various examples, the readout circuit 106 may be configured to read out the image signals through the column bitlines 112. As will be discussed, in the various examples, readout circuit 106 may include an analog-to-digital converter (ADC) in accordance with the teachings of the present disclosure. In the example, the digital image data values generated by the analog to digital converters in readout circuit 106 may then be received by function logic 108. Function logic 108 may simply store the digital image data or even manipulate the digital image data by applying post image effects (e.g., crop, rotate, remove red eye, adjust brightness, adjust contrast, or otherwise).

In one example, control circuit 110 is coupled to pixel array 102 to control operation of the plurality of photodiodes in pixel array 102. For example, control circuit 110 may generate a rolling shutter or a shutter signal for controlling image acquisition. In other examples, image acquisition is synchronized with lighting effects such as a flash.

In one example, imaging system 100 may be included in a digital, cell phone, laptop computer, an endoscope, a security camera, or an imaging device for automobile, or the like. Additionally, imaging system 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 100, extract image data from imaging system 100, or manipulate image data supplied by imaging system 100.

Figure 2:
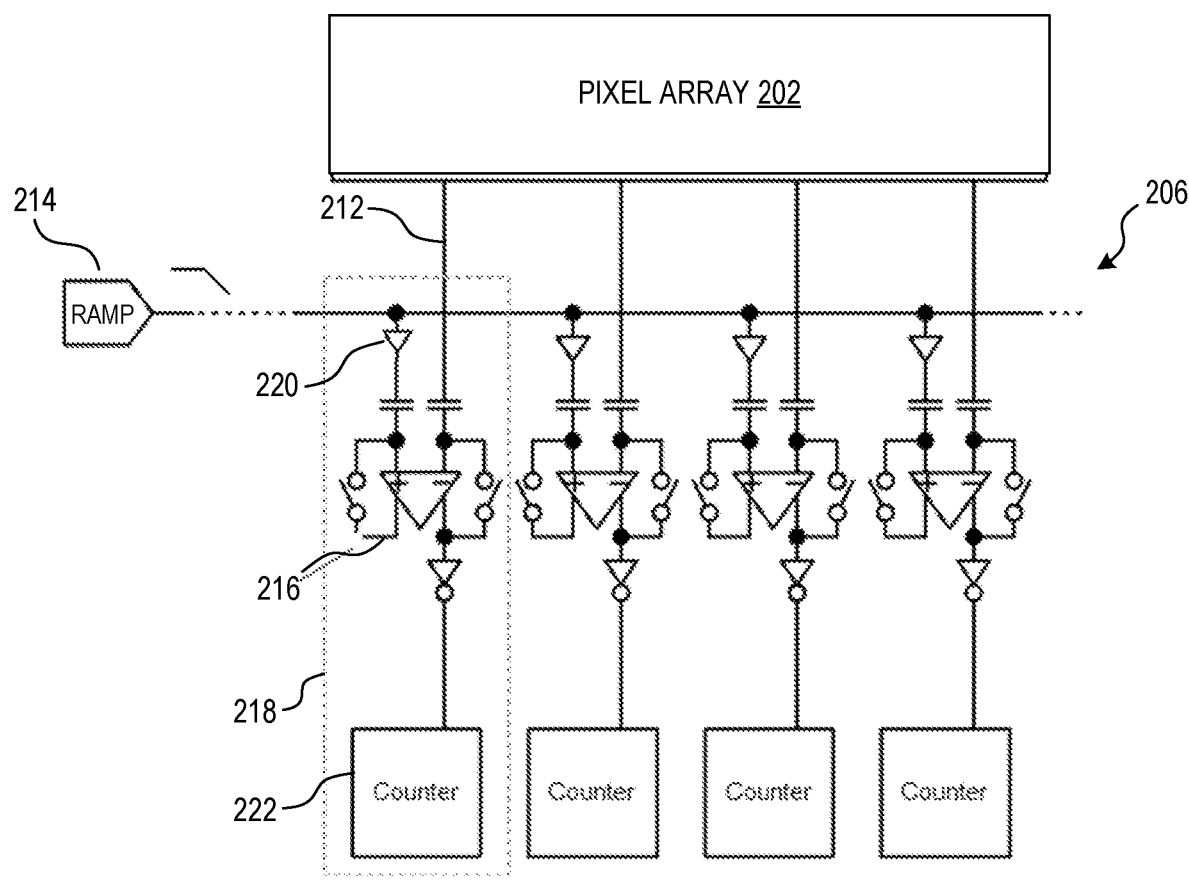
FIG. 2 illustrates a schematic of one example of a portion of a readout circuit including local ramp buffers in accordance with the teachings of the present disclosure.

FIG. 2 illustrates a schematic of one example of a portion of a readout circuit including local ramp buffers in accordance with the teachings of the present disclosure. It is appreciated that the readout circuit 206 of FIG. 2 may be an example of the readout circuit 106 included in the imaging system 100 as shown in FIG. 1, and that similarly named and numbered elements described above are coupled and function similarly below.

The readout circuit 206 includes a plurality of column circuits 218 coupled to a global ramp generator 214. In various examples, each column circuit 218 corresponds to a column of pixels in pixel array 202. Each column circuit 218 includes a comparator 216 with a first input coupled to pixel array 202 via a bitline 212 and a second input coupled to the global ramp generator 214 via a local ramp buffer 220. Each comparator 216 outputs an output signal to a counter 222 included in each column circuit 218.

In operation, the global ramp generator 214 generates a ramp signal used in single slope analog-to-digital conversion (ADC). Each one of the comparators 216 generates a respective comparator output in response to a comparison of the respective analog image data signal received via the respective bitline 212 and the ramp signal. When the two signals are equal, the comparator 216 changes its output to the counter 222, which then changes its count code by time and stores the value when the output signal from the comparator 216 changes such that the stored code correlates with the signal from the pixel array 202. The local ramp buffer 220 is configured to smooth out any fluctuations in the ramp signal, ensure that the signal is readout at a consistent rate, allow the ADC to operate at its own pace without holding up the rest of the system, and contribute to image processing.

Figure 3A:
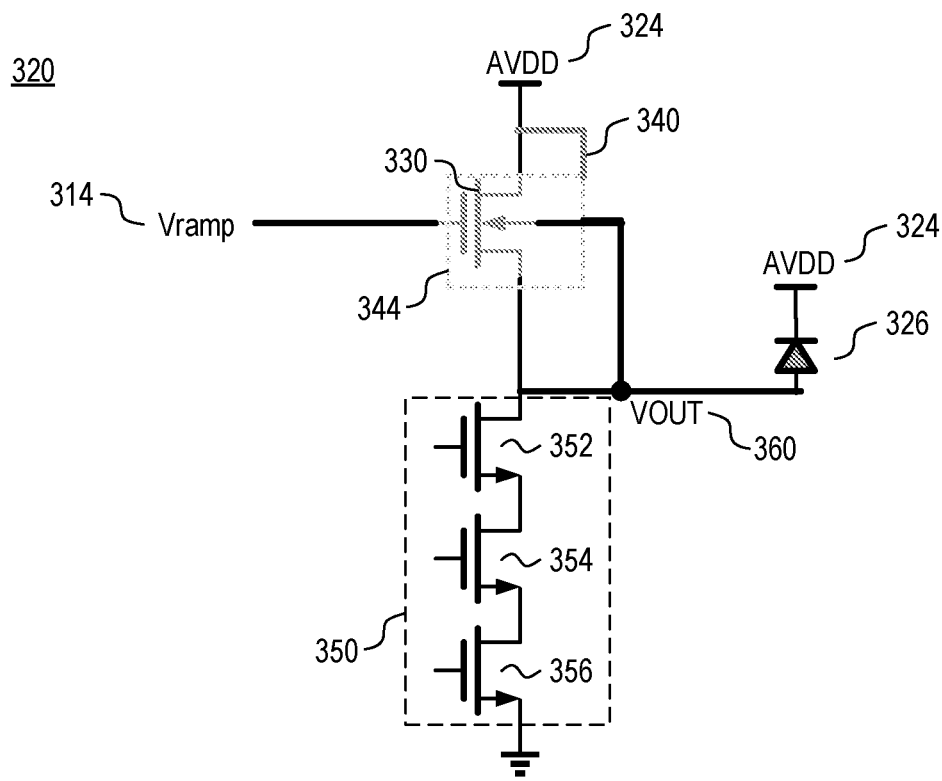
FIGS. 3A and 3B illustrate a schematic and a cross-section, respectively, of one example of a local ramp buffer with a source follower transistor in accordance with the teachings of the present disclosure.
Figure 3B:
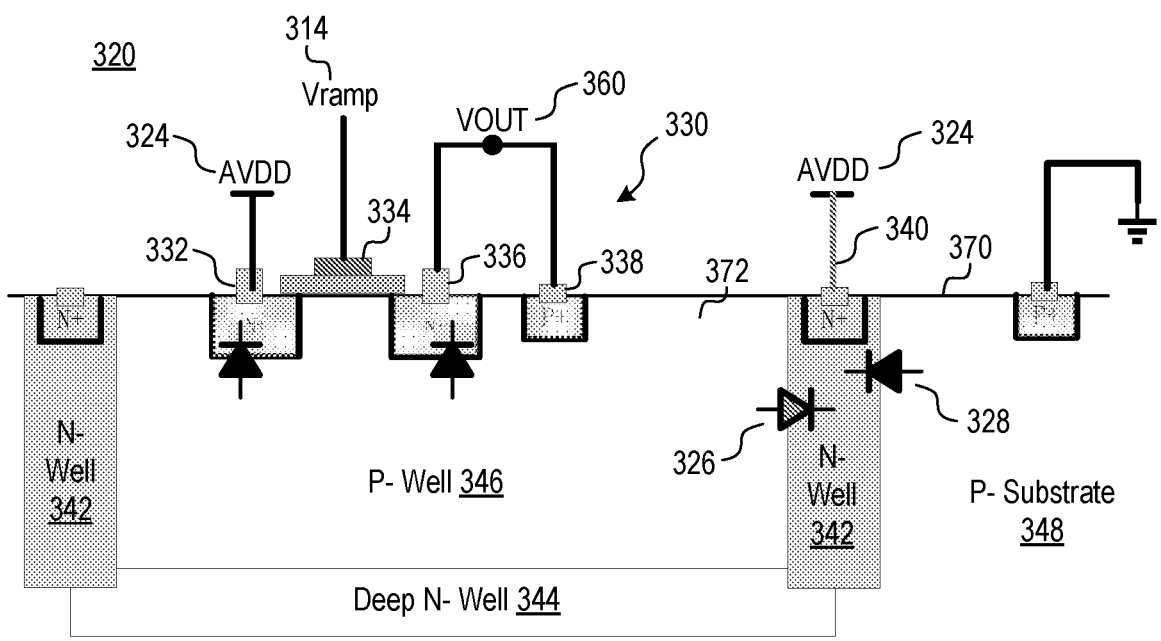

FIGS. 3A and 3B illustrate a schematic and a cross-section, respectively, of one example of a local ramp buffer with a source follower transistor in accordance with the teachings of the present disclosure. It is appreciated that the local ramp buffer 320 of FIGS. 3A and 3B may be an example of the local ramp buffer 220 included in the readout circuit 206 as shown in FIG. 2, and that similarly named and numbered elements described above are coupled and function similarly below.

Referring to both FIGS. 3A and 3B, the local ramp buffer 320 includes a deep N− well layer 344 disposed in a P− substrate 348 beneath a surface 370 of the P− substrate 348, a P− well 346 disposed between the surface 370 of the P− substrate 348 and the deep N− well layer 344, and an N− well structure 342 disposed in the P− substrate 348 and coupled to the deep N− well layer 344. The N− well structure 342 is disposed between the surface 370 of the P− substrate 348 and the deep N− well layer 344. The P− well 346 is disposed inside an opening 372 in the N− well structure 342. The N− well structure 342 and the deep N− well layer 344 are configured to isolate the P− well 346 within the opening 372 in the N− well structure 342 between the surface 370 of the P− substrate 348 and the deep N− well layer 344.

The local ramp buffer 320 also includes a source follower transistor 330 disposed in the P− well 346 and coupled between a power line AVDD 324 and ground. The source follower transistor 330 includes a gate terminal 334 coupled to a global ramp generator Vramp 314, a first N+ doped region in the P− well 346 proximate to the gate terminal 334 providing a drain terminal 332 coupled to AVDD 324, a second N+ doped region in the P− well 346 proximate to the gate terminal 334 providing a source terminal 336, and a first P+ doped region in the P− well 346 providing a body terminal 338 coupled to the source terminal 336 and configured to provide an output node VOUT 360 of the local ramp buffer 320.

A first diode 326 is formed at a first interface between the N− well structure 342 and the P− well 346. The anode of the first diode 326 is coupled to the output node VOUT 360, the body terminal 338, and the source terminal 336. In the depicted example, the cathode of the first diode 326, and hence the N− well structure 342 as well, are coupled to AVDD 324 via connection 340. A second diode 328 is formed at a second interface between the N− well structure 342 and the P− substrate 348. The anode of the second diode 328 is coupled to ground through a second P+ doped region in the P− substrate 348. The cathode of the second diode 328 is coupled to AVDD 324 via connection 340.

The local ramp buffer 320 further includes a current source 350 coupled between the output node VOUT 360 and ground. In the illustrated example, the current source 350 comprises a first transistor 356 with a gate terminal coupled to receive a current source bias voltage, a cascode transistor 352 with a gate terminal coupled to receive a cascode bias voltage, and a second transistor 354 configured to be turned on and off in response to a control signal. In various other examples, it is appreciated that the current source 350 may have different components and configurations (e.g., fewer or more transistors, switches).

In the depicted example, an AC coupling path between AVDD 324 and the output node VOUT 360 is caused due to first diode 326 acting a parasitic diode. As a result, in various examples, the local ramp buffer 320 has relatively poor Power Supply Rejection Ratio (PSRR) performance (e.g., PSRR of −26 dB with AVDD 324 having a 2 MHz AC component).

Figure 4A:
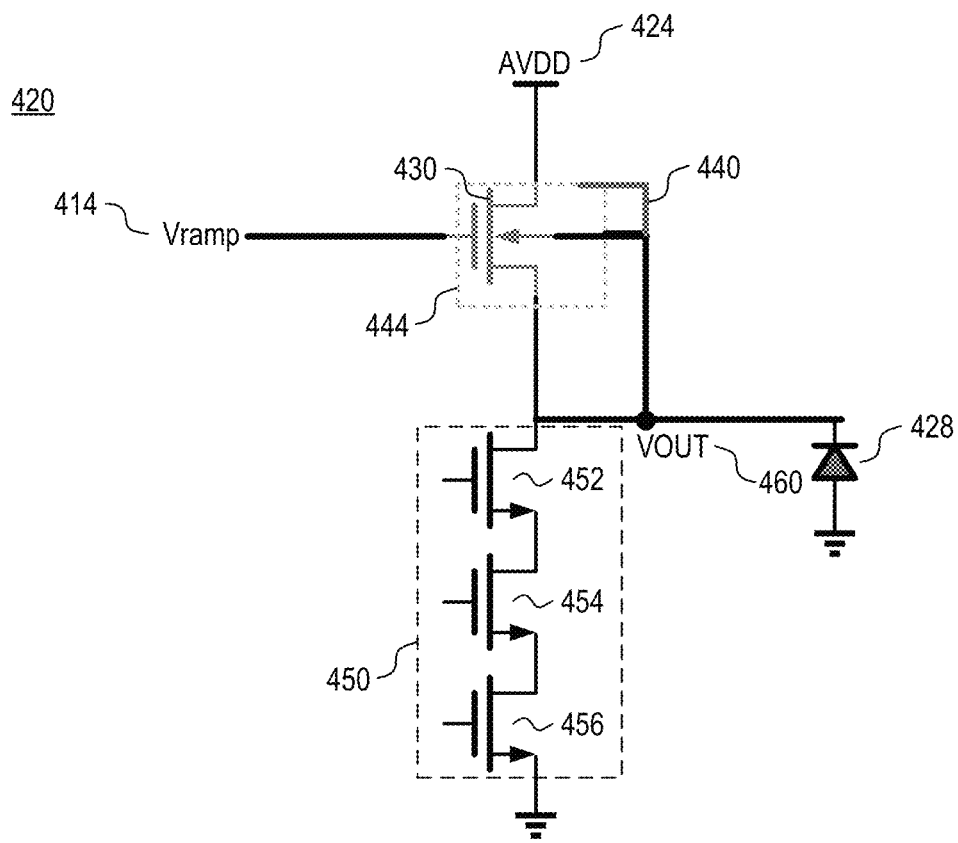
FIGS. 4A and 4B illustrate a schematic and a cross-section, respectively, of another example of a local ramp buffer with a source follower transistor in accordance with the teachings of the present disclosure.
Figure 4B:
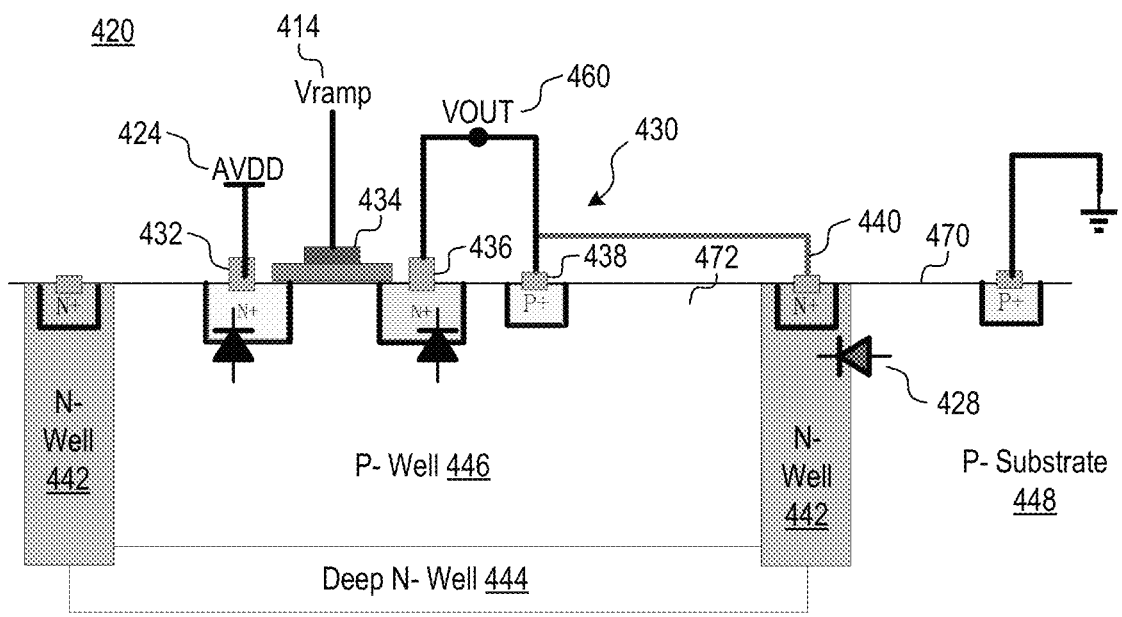

FIGS. 4A and 4B illustrate a schematic and a cross-section, respectively, of another example of a local ramp buffer with a source follower transistor in accordance with the teachings of the present disclosure. It is appreciated that the local ramp buffer 420 of FIGS. 4A and 4B may be an example of the local ramp buffer 220 included in the readout circuit 206 as shown in FIG. 2, and that similarly named and numbered elements described above are coupled and function similarly below.

Referring to both FIGS. 4A and 4B, the local ramp buffer 420 includes a deep N− well layer 444 disposed in a P− substrate 448 beneath a surface 470 of the P− substrate 448, a P− well 446 disposed between the surface 470 of the P− substrate 448 and the deep N− well layer 444, and an N− well structure 442 disposed in the P− substrate 448 and coupled to the deep N− well layer 444. The N− well structure 442 is disposed between the surface 470 of the P− substrate 448 and the deep N− well layer 444. The P− well 446 is disposed inside an opening 472 in the N− well structure 442. The N− well structure 442 and the deep N− well layer 444 are configured to isolate the P− well 446 within the opening 472 in the N− well structure 442 between the surface 470 of the P− substrate 448 and the deep N− well layer 444.

The local ramp buffer 420 also includes a source follower transistor 430 disposed in the P− well 446 and coupled between a power line AVDD 424 and ground. The source follower transistor 430 includes a gate terminal 434 coupled to a global ramp generator Vramp 414, a first N+ doped region in the P− well 446 proximate to the gate terminal 434 providing a drain terminal 432 coupled to AVDD 424, a second N+ doped region in the P− well 446 proximate to the gate terminal 434 providing a source terminal 436, and a first P+ doped region in the P− well 446 providing a body terminal 438 coupled to the source terminal 436 and configured to provide an output node VOUT 460 of the local ramp buffer 420.

A first diode 426 is formed at a first interface between the N− well structure 442 and the P− well 446. The anode of the first diode 426 is coupled to the output node VOUT 460, the body terminal 438, and the source terminal 436. In the depicted example, the cathode of the first diode 426, and hence the N− well structure 442 as well, are also coupled to the output node VOUT 460, the body terminal 438, and the source terminal 436 via connection 440. A second diode 428 is formed at a second interface between the N− well structure 442 and the P− substrate 448. The anode of the second diode 428 is coupled to ground through a second P+ doped region in the P− substrate 448. The cathode of the second diode 428 is coupled to the output node VOUT 460, the body terminal 438, and the source terminal 436 via connection 440.

The local ramp buffer 420 further includes a current source 450 coupled between the output node VOUT 460 and ground. In the illustrated example, the current source 450 comprises a first transistor 456 with a gate terminal coupled to receive a current source bias voltage, a cascode transistor 452 with a gate terminal coupled to receive a cascode bias voltage, and a second transistor 454 configured to be turned on and off in response to a control signal. It is appreciated that the current source 450 may have different components and configurations (e.g., fewer or more transistors, switches).

Unlike the local ramp buffer 320 illustrated in FIGS. 3A and 3B, the local ramp buffer 420 illustrated in FIGS. 4A and 4B does not include an AC coupling path between AVDD 424 to the output node VOUT 460 due to a parasitic diode. As a result, in various examples, the local ramp buffer 420 has relatively high Power Supply Rejection Ratio (PSRR) performance (e.g., PSRR of −35.2 dB with AVDD 424 having a 2 MHZ AC component). However, because the output node VOUT 460 is coupled to the N− well structure 442, each local ramp buffer 420 needs its own local N− well structure 442 that is isolated or separated from the output nodes of other local ramp buffers. In various examples, it is appreciated that the readout circuits of imaging systems may include thousands of local ramp buffers, meaning that the use of a local ramp buffer 420 having an output node VOUT 460 that is coupled to the N− well structure 442 as shown can require thousands of independent or isolated N− well structures 442 and deep N− well layers 444. This can result in an undesirably large lateral layout size.

Figure 5A:
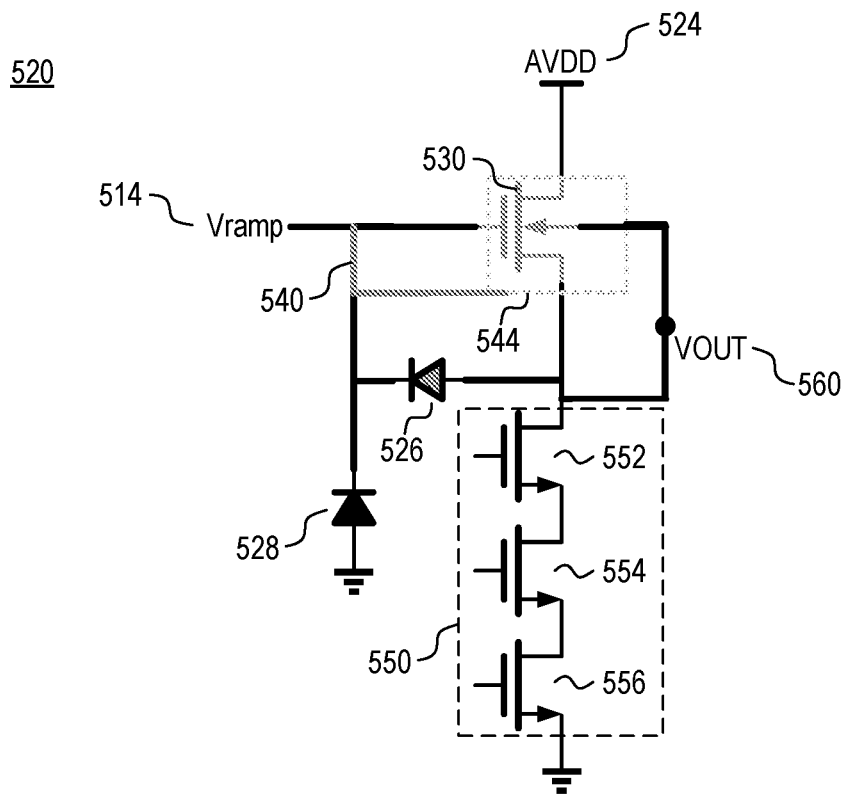
FIGS. 5A and 5B illustrate a schematic and a cross-section, respectively, of yet another example of a local ramp buffer with a source follower transistor in accordance with the teachings of the present disclosure.
Figure 5B:
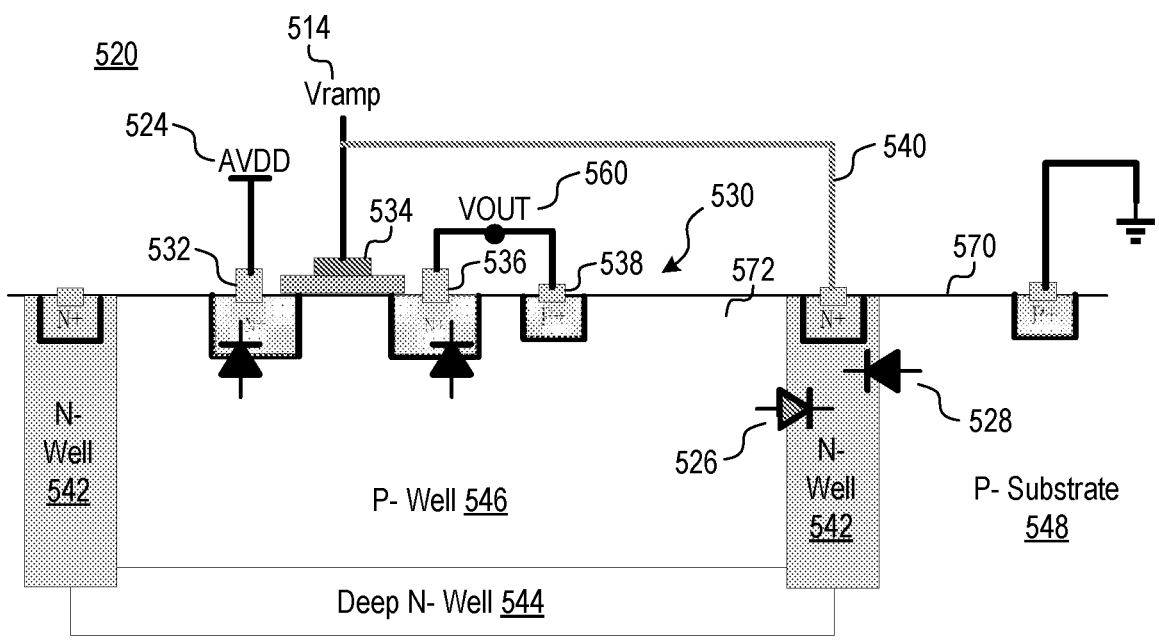

FIGS. 5A and 5B illustrate a schematic and a cross-section, respectively, of yet another example of a local ramp buffer with a source follower transistor in accordance with the teachings of the present disclosure. It is appreciated that the local ramp buffer 520 of FIGS. 5A and 5B may be an example of the local ramp buffer 220 included in the readout circuit 206 as shown in FIG. 2, and that similarly named and numbered elements described above are coupled and function similarly below.

Referring to both FIGS. 5A and 5B, the local ramp buffer 520 includes a deep N− well layer 544 disposed in a P− substrate 548 beneath a surface 570 of the P− substrate 548, a P− well 546 disposed between the surface 570 of the P− substrate 548 and the deep N− well layer 544, and an N− well structure 542 disposed in the P− substrate 548 and coupled to the deep N− well layer 544. The N− well structure 542 is disposed between the surface 570 of the P− substrate 548 and the deep N− well layer 544. The P− well 546 is disposed inside an opening 572 in the N− well structure 542. The N− well structure 542 and the deep N− well layer 544 are configured to isolate the P− well 546 within the opening 572 in the N− well structure 542 between the surface 570 of the P− substrate 548 and the deep N− well layer 544.

The local ramp buffer 520 also includes a source follower transistor 530 disposed in the P− well 546 and coupled between a power line AVDD 524 and ground. The source follower transistor 530 includes a gate terminal 534 coupled to a global ramp generator Vramp 514, a first N+ doped region in the P− well 546 proximate to the gate terminal 534 providing a drain terminal 532 coupled to AVDD 524, a second N+ doped region in the P− well 546 proximate to the gate terminal 534 providing a source terminal 536, and a first P+ doped region in the P− well 546 providing a body terminal 538 coupled to the source terminal 536 and configured to provide an output node VOUT 560 of the local ramp buffer 520.

A first diode 526 is formed at a first interface between the N− well structure 542 and the P− well 546. The anode of the first diode 526 is coupled to the output node VOUT 560, the body terminal 538, and the source terminal 536. In the depicted example, the cathode of the first diode 526, and hence the N− well structure 542 as well, are coupled to the gate terminal 534 and the global ramp generator Vramp 514 via connection 540. A second diode 528 is formed at a second interface between the N− well structure 542 and the P− substrate 548. The anode of the second diode 528 is coupled to ground through a second P+ doped region in the P− substrate 548. The cathode of the second diode 528 is coupled to the gate terminal 534 and the global ramp generator Vramp 514 via connection 540.

The local ramp buffer 520 further includes a current source 550 coupled between the output node VOUT 560 and ground. In the illustrated example, the current source 550 comprises a first transistor 556 with a gate terminal coupled to receive a current source bias voltage, a cascode transistor 552 with a gate terminal coupled to receive a cascode bias voltage, and a second transistor 554 configured to be turned on and off in response to a control signal. It is appreciated that the current source 550 may have different components and configurations (e.g., fewer or more transistors, switches).

Like the local ramp buffer 420 illustrated in FIGS. 4A and 4B, the local ramp buffer 520 illustrated in FIGS. 5A and 5B does not include an AC coupling path between AVDD 524 to the output node VOUT 560 due to a parasitic diode. As a result, in various examples, the local ramp buffer 520 has relatively high Power Supply Rejection Ratio (PSRR) performance (e.g., PSRR of −35.5 dB with AVDD 524 having a 2 MHZ AC component). Moreover, because the N− well structure 542 is coupled to the gate terminal 534 and the global ramp generator Vramp 514 and not the local output node VOUT 560, the N− well structure 542 can be shared with other local ramp buffers in accordance with the teachings of the present disclosure.

Figure 6:
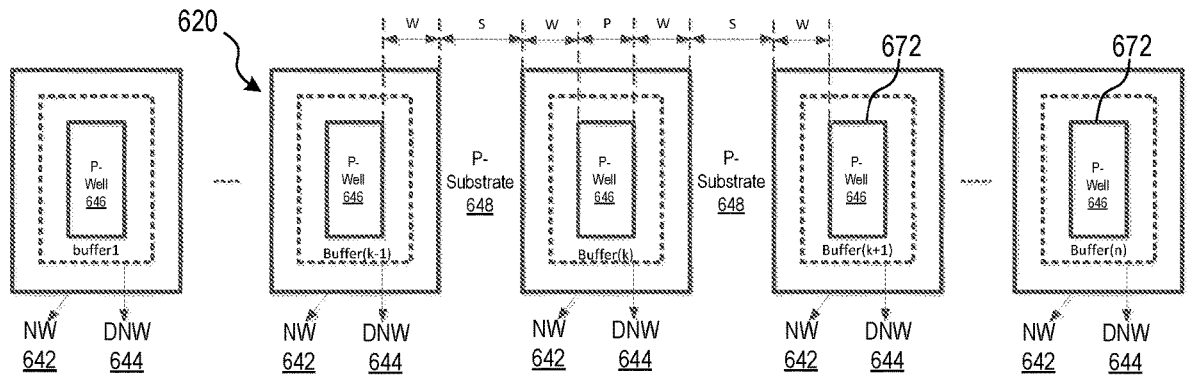
FIG. 6 illustrates a top-view layout of one example of a plurality of local ramp buffers included in the same readout circuit in accordance with the teachings of the present disclosure.

FIG. 6 illustrates a top-view layout of one example of a plurality of local ramp buffers included in the same readout circuit in accordance with the teachings of the present disclosure. It is appreciated that each local ramp buffer 620 of FIG. 6 may be an example of the local ramp buffer 220 included in the readout circuit 206 as shown in FIG. 2 and/or the local ramp buffer 420 shown in FIGS. 4A and 4B, and that similarly named and numbered elements described above are coupled and function similarly below.

It is appreciated that the each of the output nodes of the local ramp buffers 620 are isolated or separated from one another. As such, the local ramp buffers 620 are therefore unable to share N− well structures 642 (e.g., for reasons discussed above with respect to local ramp buffer 420 illustrated in FIGS. 4A and 4B). When fabricating the local ramp buffers 620, each P− well 646 is disposed inside an opening 672 in each N− well structure 642 and between the surface of the P− substrate 648 and each deep N− well layer 644 (illustrated with dotted lines to show that the deep N− well layer 644 is below both the P− well 646 and the N− well structure 642). When the local ramp buffers 620 are arranged laterally, as illustrated in FIG. 6, each P− well 646 has a dimension P in the direction of the lateral arrangement. Each N− well structure 642 has a dimension W on either side of the P− well 646 in the direction of the lateral arrangement. Each N− well structure 642 is separated from a neighboring N− well structure 642 by a dimension S. Assuming there are n local ramp buffers, the total width (i.e., total dimension along the direction of the lateral arrangement), ignoring portions of the N− well structures 642 on either end, is equal to P*n+(2W+S)*(n−1).

Figure 7A:
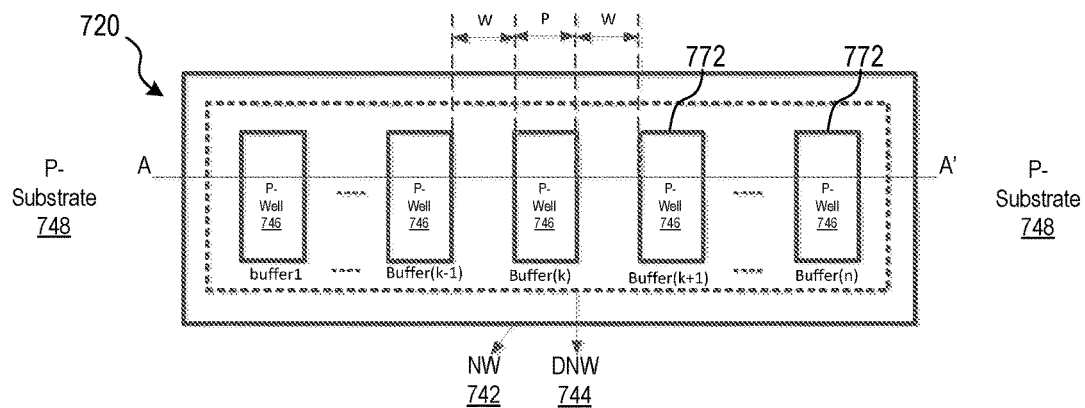
FIGS. 7A and 7B illustrate a top-view layout and a cross-section, respectively, of another example of a plurality of local ramp buffers included in the same readout circuit in accordance with the teachings of the present disclosure.
Figure 7B:
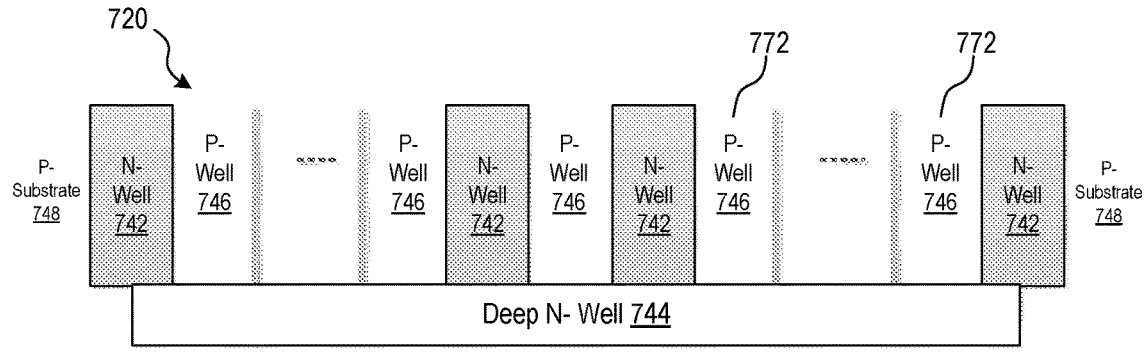

FIGS. 7A and 7B illustrate a top-view layout and a cross-section along dashed line A-A', respectively, of another example of a plurality of local ramp buffers in the same readout circuit in accordance with the teachings of the present disclosure. It is appreciated that each local ramp buffer 720 of FIGS. 7A and 7B may be an example of the local ramp buffer 220 included in the readout circuit 206 as shown in FIG. 2 and/or the local ramp buffer 520 shown in FIGS. 5A and 5B, and that similarly named and numbered elements described above are coupled and function similarly below.

In the depicted example, it is appreciated that each of the gate terminals of the source follow transistors of the local ramp buffers 720 are coupled to a global ramp generator and can therefore share an N− well structure 742 (e.g., for reasons discussed above with respect to local ramp buffer 520 illustrated in FIGS. 5A and 5B). When fabricating the local ramp buffers 720, each of a plurality of P− wells 746 is disposed inside a respective one of a plurality of openings 772 in the shared N− well structure 742 and between the surface of the P− substrate 748 and a shared deep N− well layer 744 (illustrated with dotted lines to show that the shared deep N− well layer 744 is below the plurality of P− wells 746 and the shared N− well structure 742). When the local ramp buffers 720 are arranged laterally, as illustrated in FIGS. 7A and 7B, each of the plurality of P− wells 746 has a dimension P in the direction of the lateral arrangement. Neighboring P− wells 746 are separated by a portion of the shared N− well structure 742 with a dimension W in the direction of the lateral arrangement. Assuming there are n local ramp buffers, the total width (i.e., total dimension along the direction of the lateral arrangement), ignoring portions of the shared N− well structure 742 on either end, is equal to P*n+W*(n−1).

Therefore, comparing the example illustrated in FIGS. 7A and 7B and the example illustrated in FIG. 6, the total width is reduced by [P*n+(2W+S)*(n−1)]− [P*n+W*(n−1)]=(W+S)*(n−1) and the area reduction ratio is [(W+S)*(n−1)]/[P*n+(2W+S)*(n−1)]. This reduction in the lateral layout size has the advantage of lowering the overall cost associated with the die size. In one example, a readout circuit has 512 local ramp buffers (i.e., n=512), P=4.8 μm, W=0.8 μm, and S=2.4 μm, so the area reduction ratio would be approximately 36%. It is appreciated that the parameters n. P. W, and S can have different values and that the area reduction ratio can vary accordingly.

The above description of illustrated examples of the disclosure, including what is described in the Abstract, is not intended to be exhaustive or to limit the disclosure to the precise forms disclosed. While specific examples of the disclosure are described herein for illustrative purposes, various modifications are possible within the scope of the disclosure, as those skilled in the relevant art will recognize.

These modifications can be made to the disclosure in light of the above detailed description. The terms used in the following claims should not be construed to limit the disclosure to the specific examples disclosed in the specification. Rather, the scope of the disclosure is to be determined entirely by the following claims, which are to be construed in accordance with established doctrines of claim interpretation.

What is claimed is:

1. A local ramp buffer, comprising:
   a deep N− well layer disposed in a P− substrate beneath a surface of the P− substrate;
   a P− well disposed between the surface of the P− substrate and the deep N− well layer;
   an N− well structure disposed in the P− substrate and coupled to the deep N− well layer, wherein the N− well structure is disposed between the surface of the P− substrate and the deep N− well layer, wherein the P− well is disposed inside an opening in the N− well structure, and wherein the N− well structure and the deep N− well layer are configured to isolate the P− well within the opening in the N− well structure between the surface of the P− substrate and the deep N− well layer; and
   a source follower transistor disposed in the P− well, wherein the source follower transistor includes a gate terminal coupled to the N− well structure and a ramp generator.

2. The local ramp buffer of claim 1, wherein the source follower transistor further includes:
   a first N+ doped region in the P− well proximate to the gate terminal to provide a drain terminal of the source follower transistor, wherein the drain terminal is coupled to a power line;
   a second N+ doped region in the P− well proximate to the gate terminal to provide a source terminal of the source follower transistor; and
   a P+ doped region in the P− well to provide a body terminal of the source follower transistor, wherein the source terminal is coupled to the body terminal and is configured to provide an output node of the local ramp buffer.

3. The local ramp buffer of claim 2, wherein a first diode is formed at a first interface between the N− well structure and the P− well, wherein an anode of the first diode is coupled to the body terminal and the source terminal, and wherein a cathode of the first diode is coupled to the gate terminal and the ramp generator.

4. The local ramp buffer of claim 2, wherein a second diode is formed at a second interface between the N− well structure and the P− substrate, wherein an anode of the second diode is coupled to ground through the P− substrate, and wherein a cathode of the second diode is coupled to the gate terminal and the ramp generator.

5. The local ramp buffer of claim 2, further comprising a current source coupled between the output node and ground.

6. The local ramp buffer of claim 5, wherein the current source comprises:
   a first transistor, wherein a gate of the first transistor is coupled to receive a current source bias voltage; and
   a cascode transistor coupled to the first transistor, wherein a gate of the cascode transistor is coupled to receive a cascode bias voltage, and wherein the first transistor and the cascode transistor are coupled between the output node and ground.

7. The local ramp buffer of claim 6, wherein the current source further comprises a second transistor coupled to the first transistor and the cascode transistor, wherein the first transistor, the second transistor, and the cascode transistor are coupled between the output node and ground, and wherein the second transistor is configured to be turned on and off in response to a control signal.

8. The local ramp buffer of claim 1, wherein:
   the N− well structure includes a plurality of openings;
   the plurality of openings include the opening;
   P− wells corresponding to a plurality of local ramp buffers are each disposed within a corresponding one of the plurality of openings in the N− well structure; and
   the plurality of local ramp buffers include the local ramp buffer.

9. The local ramp buffer of claim 8, wherein the N− well structure and the deep N− well layer are configured to isolate each of the P− wells within the corresponding one of the plurality of openings in the N− well structure.

10. A method of fabricating a plurality of local ramp buffers, comprising:
    disposing a deep N− well layer in a P− substrate beneath a surface of the P− substrate;
    disposing an N− well structure with a plurality of openings in the P− substrate and between the surface of the P− substrate and the deep N− well layer;
    coupling the N− well structure to the deep N− well layer;
    disposing a plurality of P− wells inside the plurality of openings in the N− well structure, wherein the N− well structure and the deep N− well layer are configured to isolate each of the plurality of P− wells within the plurality of openings in the N− well structure between the surface of the P− substrate and the deep N− well layer, and wherein each of the plurality of P− wells corresponds to one of the plurality of local ramp buffers; and disposing a plurality of source follower transistors in the plurality of P− wells, wherein each of the plurality of source follower transistors includes a gate terminal coupled to the N− well structure and a ramp generator.

11. The method of claim 10, wherein each one of the plurality of P− wells is disposed in a respective one of the plurality of openings in the N− well structure.

12. The method of claim 10, wherein each one of the plurality of source follower transistors is disposed in a respective one of the plurality of P− wells.

13. The method of claim 10, wherein each of the plurality of source follower transistors further includes:
 a first N+ doped region in one of the plurality of P− wells proximate to the gate terminal to provide a drain terminal of the source follower transistor, wherein the drain terminal is coupled to a power line;
 a second N+ doped region in the one of the plurality of P− wells proximate to the gate terminal to provide a source terminal of the source follower transistor; and
 a P+ doped region in the one of the plurality of P− wells to provide a body terminal of the source follower transistor, wherein the source terminal is coupled to the body terminal and is configured to provide an output node of a respective local ramp buffer.

14. The method of claim 13, wherein for each of the plurality of local ramp buffers:
 a first diode is formed at a first interface between the N− well structure and the P− well of the respective local ramp buffer;
 an anode of the first diode is coupled to the body terminal and the source terminal; and
 a cathode of the first diode is coupled to the gate terminal and the ramp generator.

15. The method of claim 13, wherein a second diode is formed at a second interface between the N− well structure and the P− substrate, wherein an anode of the second diode is coupled to ground through the P− substrate, and wherein a cathode of the second diode is coupled to the gate terminals of the plurality of source follower transistors and the ramp generator.

16. The method of claim 13, further comprising:
 for each of the plurality of local ramp buffers
 coupling a current source between the output node and ground.

17. The method of claim 16, wherein the current source comprises:
 a first transistor, wherein a gate of the first transistor is coupled to receive a current source bias voltage; and
 a cascode transistor coupled to the first transistor, wherein a gate of the cascode transistor is coupled to receive a cascode bias voltage, and wherein the first transistor and the cascode transistor are coupled between the output node and ground.

18. The method of claim 17, wherein the current source further comprises a second transistor coupled to the first transistor and the cascode transistor, wherein the first transistor, the second transistor, and the cascode transistor are coupled between the output node and ground, and wherein the second transistor is configured to be turned on and off in response to a control signal.

* * * * *